United States Patent
Lie et al.

(10) Patent No.: US 6,734,504 B1
(45) Date of Patent: May 11, 2004

(54) METHOD OF PROVIDING HBM PROTECTION WITH A DECOUPLED HBM STRUCTURE

(75) Inventors: James H. Lie, Santa Clara, CA (US); Yue Chen, San Jose, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 10/117,428

(22) Filed: Apr. 5, 2002

(51) Int. Cl.[7] .............................................. H01L 23/62
(52) U.S. Cl. ..................... 257/355; 257/356; 257/357; 257/360; 257/361; 257/546; 257/786; 361/19; 361/54; 361/56; 361/111; 361/91.1; 361/91.2; 361/91.5
(58) Field of Search ............................... 257/355–357, 257/360–361, 546, 786; 361/19, 54, 56, 111, 91.1, 91.2, 91.5

(56) References Cited

U.S. PATENT DOCUMENTS

| | | | |
|---|---|---|---|
| 5,359,211 A | * 10/1994 | Croft | 257/173 |
| 5,506,742 A | 4/1996 | Marum | |
| 5,637,901 A | 6/1997 | Beigel et al. | |
| 5,719,733 A | 2/1998 | Wei et al. | |
| 5,731,945 A | * 3/1998 | Bertin et al. | 361/111 |
| 5,744,840 A | 4/1998 | Ng | |
| 5,835,986 A | 11/1998 | Wei et al. | |
| 5,852,315 A | 12/1998 | Ker et al. | |
| 5,946,175 A | 8/1999 | Yu | |
| 6,037,636 A | 3/2000 | Crippen | |
| 6,066,879 A | 5/2000 | Lee et al. | |
| 6,104,589 A | 8/2000 | Williamson | |
| 6,114,761 A | * 9/2000 | Mertol et al. | 257/722 |
| 6,128,171 A | 10/2000 | Iniewski et al. | |
| 6,147,538 A | 11/2000 | Andresen et al. | |
| 6,163,446 A | * 12/2000 | Norstrom et al. | 361/111 |
| 6,177,298 B1 | 1/2001 | Quigley | |
| 6,194,764 B1 | 2/2001 | Gossner et al. | |
| 6,204,715 B1 | 3/2001 | Sellnau et al. | |
| 6,215,251 B1 | 4/2001 | Orchard-Webb | |
| 6,238,975 B1 | 5/2001 | Fliesler et al. | |
| 6,246,113 B1 | 6/2001 | Lin | |
| 6,246,122 B1 | 6/2001 | Lin | |
| 6,249,410 B1 | 6/2001 | Ker et al. | |
| 6,249,413 B1 | 6/2001 | Duvvury | |
| 6,268,992 B1 | 7/2001 | Lee et al. | |
| 6,304,127 B1 | 10/2001 | Lin | |
| 6,304,423 B1 | 10/2001 | Long et al. | |
| 6,310,379 B1 | 10/2001 | Andresen et al. | |
| 6,310,380 B1 | 10/2001 | Cai et al. | |
| 6,320,230 B1 | 11/2001 | Yu | |
| 6,320,232 B1 | 11/2001 | Gossner et al. | |
| 6,327,126 B1 | * 12/2001 | Miller et al. | 361/56 |
| 6,531,932 B1 | * 3/2003 | Givind et al. | 333/34 |
| 6,556,409 B1 | * 4/2003 | Chittipeddi et al. | 361/111 |
| 2003/0058591 A1 | * 3/2003 | Johnson | 361/56 |

* cited by examiner

*Primary Examiner*—David Nelms
*Assistant Examiner*—Andy Huynh
(74) *Attorney, Agent, or Firm*—Kevin L. Daffer; Conley Rose P.C.

(57) ABSTRACT

A semiconductor device that includes an integrated circuit and an HBM structure formed on different semiconductor substrates is provided. The HBM structure may include input or output or input/output circuitry coupled to the integrated circuit and protection structures coupled to the input or output or input/output circuitry. In an embodiment, the integrated circuit may include input or output or input/output structures spaced across an area of the integrated circuit. The input or output or input/output circuitry of the HBM structure may be coupled to the input or output or input/output structures of the integrated circuit. A method for developing a design for an HBM structure is also provided. The method may include coupling an HBM structure formed on a first semiconductor substrate to an integrated circuit formed on a second semiconductor substrate. The method may also include testing the HBM structure and altering the HBM design based on the testing.

20 Claims, 7 Drawing Sheets

METHOD OF PROVIDING HBM PROTECTION WITH A DECOUPLED HBM STRUCTURE

BACKGROUND OF THE INVENTION

1. Field of the Invention

This invention relates to electrostatic discharge protection of integrated circuit devices, and more particularly, to an electrostatic discharge protection device that is decoupled from an integrated circuit device.

2. Description of the Related Art

The following descriptions and examples are not admitted to be prior art by virtue of their inclusion within this section.

Integrated circuit devices such as common silicon integrated circuits typically have delicate construction that is susceptible to damage by voltage spikes such as voltage spikes caused by electrostatic discharge. Such voltage spikes may occur in various situations such as during manufacturing of an integrated circuit, handling of the integrated circuit after packaging, and handling of a board after assembly such as during use of the board. There are a number of models that may be used to describe such damage to an integrated circuit device. For example, the human body model (HBM) describes a voltage spike condition caused by electrostatic discharge from a human body to an integrated circuit device. For an integrated circuit device to be commercially viable, it has to be protected against this condition except under special circumstances such as when manufacturers and customers specifically agree on the lack of such protection. This agreed upon lack of HBM protection is necessary because lack of this protection may require special handling of the integrated circuit device that complicates logistics, increases handling costs, and increases the probability of damaging the device.

To protect against electrostatic discharge, a silicon die typically includes protection circuitry (or an "HBM structure") that will divert or otherwise dissipate the energy caused by a voltage spike. In this manner, the core logic circuitry of the die may not be damaged by the voltage spike. An HBM structure is the "first line of defense" for input/output (I/O) cells. Therefore, the structure is integrated into the die and is adjacent to or outside of the I/O cells through which the die interacts with the external environment (i.e., through device pins).

Development of the HBM structure, however, is usually difficult as development hinges upon understanding of process technology and how its various underlying factors interact so that an adequate structure can be developed. An adequate HBM structure also has to react fast to a voltage spike (i.e., it has to react faster than the internal circuitry) to be effective. In addition, HBM structures have to dissipate relatively large amounts of energy. On the other hand, an HBM structure cannot present an undue burden to I/O cells in areas such as current consumption and capacitance as these factors affect the performance of the device.

There are several disadvantages of currently available HBM structures. For example, the electrical design of an HBM structure is difficult to develop correctly without some experimentation due to lack of means of accurate simulations. In particular, the electrical design of an HBM structure may be difficult to develop if a new process is being used for the die. In addition, the practice of integrating an HBM structure into the base die, where the logic and regular I/O circuitry reside, may cause revision of the entire die if the HBM structure is inadequately designed. Such revision may be especially problematic if the revision of the die is solely required due to the HBM structure because the expensive tape-out of the die adds no value to the performance or functionality of the device. Additionally, while an optimal HBM structure is desired for a device, the fact that its revision causes expensive revision of the entire die and re-tape-out discourages experimentation of HBM structures thereby hindering HBM structure design. Furthermore, an HBM structure may enlarge the size of the integrated circuit die thereby increasing die cost and making a die revision for any reason more expensive than it would be without the HBM structure. Revision of an HBM structure if an existing one is inadequate requires re-layout of the device that often goes beyond the structure itself. For example, such revision may affect the I/O cell layout of the device. This revision and/or re-layout may delay product launch and increase the product development time and cost.

Accordingly, it may be advantageous to develop an HBM structure that allows revision of the HBM structure without revision of the entire die and/or re-tape-out or re-layout of the entire device, allows less problematic and less expensive revision such that better HBM structures may be developed, reduces the size of the die thereby reducing cost of the die and revision of the die for any reason, reduces product development time and costs, and allows reuse of the HBM structure for various integrated circuits.

SUMMARY OF THE INVENTION

The problems outlined above may be in large part addressed by an embodiment of a semiconductor device including an integrated circuit and an HBM structure formed on separate semiconductor substrates. Various embodiments described herein may reduce, and even eliminate, problems such as HBM structure-induced integrated circuit latch-up, integrated circuit partitioning problems due to the HBM structure, and product delay due to HBM structure development. In addition, if an integrated circuit and an HBM structure are formed on different semiconductor substrates, then the die size of the integrated circuit may be reduced thereby reducing integrated circuit manufacturing costs. There are several additional advantages to the various embodiments as described herein.

In an embodiment, the integrated circuit may be formed on a first semiconductor substrate. The HBM structure may be formed on a second semiconductor substrate. The integrated circuit may include, for example, logic circuitry, charged-device model (CDM) structures, other circuitry typically included in an application specific integrated circuit (ASIC), and optionally portions of the input/output cells of the integrated circuit. The HBM structure may include input or output or input/output circuitry coupled to the integrated circuit. In an embodiment, the HBM structure may also include input/output cells of the integrated circuit. The input or output or input/output circuitry may be included in the input/output cells. The HBM structure may also include protection structures coupled to the input or output or input/output circuitry. The semiconductor device may also include a package substrate to which the first and second semiconductor substrates may be connected directly or through a pair of back to back diodes. The protection structures of the HBM structure may be further coupled to signal traces of the package substrate. In this manner, the protection structures may be configured to protect the input/output cells of the integrated circuit from electrostatic discharge that may be conducted through the signal traces.

In an embodiment, the input or output or input/output circuitry of the HBM structure may be coupled to the integrated circuit by wire bonding. In an alternative embodiment, the input or output or input/output circuitry of the HBM structure and the integrated circuit may be coupled to a signal trace within the package substrate by wire bonding. In a further embodiment, the input or output or input/output circuitry of the HBM structure and the integrated circuit may be connected to a signal trace within the package substrate by solder bumps. According to yet another embodiment, the semiconductor device may also include two or more HBM structures. Each of the two or more HBM structures may include a portion of the input or output or input/output circuitry and protection structures coupled to the portion of the input or output or input/output circuitry.

Latch-up and other problems associated with the HBM structure may be reduced, and even eliminated, by an HBM structure de-coupled from the integrated circuit. For example, when the HBM structure is integrated into the integrated circuit as is currently done, the HBM structure and the integrated circuit are formed on a common substrate. Typically, HBM structures are large in size. In this manner, a large number of minority carriers may be injected from the HBM structure to the integrated circuit. Such carrier flow may cause latch-up in the integrated circuit in the event of a sudden large current flow during device operation. Currently, to reduce latch-up of the integrated circuit, the input/output portion of the HBM structure may be isolated from the integrated circuit by inserting complex guard ring structures between the HBM portion and the integrated circuits. Carriers, however, may still flow from the HBM structure to the integrated circuit across the common substrate. In embodiments as described herein, however, minority carrier flow from the HBM structure into the integrated circuit may be greatly reduced because the HBM structure and the integrated circuit are formed on different semiconductor substrates. Therefore, latch-up of the integrated circuit may be reduced due to the limited carrier flow from the HBM structure into the integrated circuit.

In addition, different manufacturing processes may be used to form the HBM structure and the integrated circuit because the HBM structure and the integrated circuit are not formed on the same semiconductor substrate. In this manner, the HBM structure may be formed using a processing technology different from that used to form the integrated circuit. For example, the integrated circuit may be formed using advanced processing technology with relatively fine line width and a relatively large number of layers of metal. In contrast, the HBM structure, due to simpler design, may be formed using more traditional technology with larger line width and fewer metal layers. As such, devices of the integrated circuit may have substantially different average critical dimensions than devices of the HBM structure. In addition, the HBM structure may have a different number of layers than the integrated circuit. Therefore, forming the HBM structure with more traditional technology may lower overall costs of the device.

Another embodiment relates to a semiconductor device that also includes an integrated circuit and an HBM structure formed on different semiconductor substrates. The HBM structure may be formed on a second semiconductor substrate. In this embodiment, the integrated circuit may be formed on a first semiconductor substrate. The integrated circuit may include input or output or input/output structures spaced across an area of the integrated circuit. The area may include a central portion of the integrated circuit and a peripheral portion of the integrated circuit. In an embodiment, the input or output or input/output structures may not be surrounded by guard rings. Guard rings may include a continuous ring of n-diffusion in an n-well connected to $V_{DD}$ and a ring of p-diffusion in a p-well connected to $V_{SS}$ to collect minority carriers thereby reducing flow of the carriers into a portion of the substrate occupied by the integrated circuit. Guard rings, however, require a relatively large area of the substrate and increase the difficulty of designing an integrated circuit having input/output cells not only at the periphery of the integrated circuit but also proximate a central portion of the integrated circuit. Therefore, eliminating such guard rings reduces the difficulty of silicon partitioning.

Moreover, as the speed of an integrated circuit increases, wire bonding and placing inputs or outputs or input/outputs proximate the periphery of the integrated circuit, but not proximate the central portion of the integrated circuit, may not be adequate for such integrated circuits. For example, isolating the HBM structure to protect the integrated circuit by limiting the input or output or input/output locations within the integrated circuit may result in inefficient use of die space and reduced performance of such high speed integrated circuits. De-coupling the HBM structure and the integrated circuit may, therefore, reduce, and even eliminate, such concerns.

The HBM structure may include input or output or input/output circuitry coupled to the input or output or input/output structures of the integrated circuit. In an embodiment, the input or output or input/output structures may be self-aligned to the input or output or input/output circuitry. For example, the semiconductor device may include a package substrate to which the first and second semiconductor substrates may be connected. The first and second semiconductor substrates may be connected to the package substrate in a flip chip stacked ball grid array configuration. Therefore, in such an embodiment, input or output or input/output structures may be spaced across the area of the integrated circuit at convenient positions and at positions that may increase circuit performance without constructing complicated tapping to isolate the HBM structure from the integrated circuit. In addition, the HBM structure may include protection structures coupled to the input or output or input/output circuitry.

A further embodiment relates to a method for developing a design for an HBM structure. The method may include forming an HBM structure having an initial HBM design on a first semiconductor substrate. The method may also include coupling the first semiconductor substrate to a package substrate and coupling the HBM structure to an integrated circuit coupled to the package substrate. The integrated circuit may be formed on a second semiconductor substrate. In addition, the method may include testing the HBM structure. The method may further include altering the initial HBM design based on the testing.

In an embodiment, the method may include forming an additional HBM structure having the altered initial design without altering a design of the integrated circuit. The method may also include forming an additional HBM structure having the altered initial design without altering manufacturing of the integrated circuit. In an embodiment, the method may include altering a design of the integrated circuit without further altering the initial design of the HBM structure. Altering an HBM structure die does not require altering an integrated circuit die and vice versa because the die are formed on separate semiconductor substrates. Altering one of the die, instead of both die, will reduce re-layout time and costs associated with re-layout of both die.

The method may also include forming an additional HBM structure having the altered initial design without manufacturing an additional integrated circuit Therefore, such embodiments may reduce the costs of manufacturing another integrated circuit on the same die as the additional HBM structure. Furthermore, because the HBM structure may be manufactured separately from the integrated circuit, the HBM structure may be used to protect other integrated circuits and perhaps at a reduced cost. In another embodiment, the method may further include using the HBM structure until an additional HBM structure having the altered initial design can be formed and coupled to the integrated circuit. In this manner, if the HBM structure will sufficiently protect a new integrated circuit product, the HBM structure may be used as an interim solution for the new integrated circuit product while an optimal HBM structure is being developed for the new product thereby reducing product delay. As such, the new product may be shipped as an HBM protected device while the development of the HBM structure continues. Such a method may also be used for integrated circuits having an integrated HBM structure.

Additional HBM structures may be experimentally tested as described herein. ESD structures such as an HBM structure are often difficult to develop without some experimentation. For example, an adequate HBM structure is often difficult to determine prior to experimentation because an adequate design of the structure often requires process technology characterization, which may be difficult to obtain without taping out the integrated circuit. Determining an adequate HBM structure may be particularly difficult if the integrated circuit process technology includes new processes and/or technologies. The development of such structures also tends to be performed proximate the end of the product design cycle. Therefore, developing an HBM structure separately from an integrated circuit may reduce the development time for the HBM structure thereby speeding product launch.

BRIEF DESCRIPTION OF THE DRAWINGS

Other objects and advantages of the invention will become apparent upon reading the following detailed description and upon reference to the accompanying drawings in which.

Figure 1:
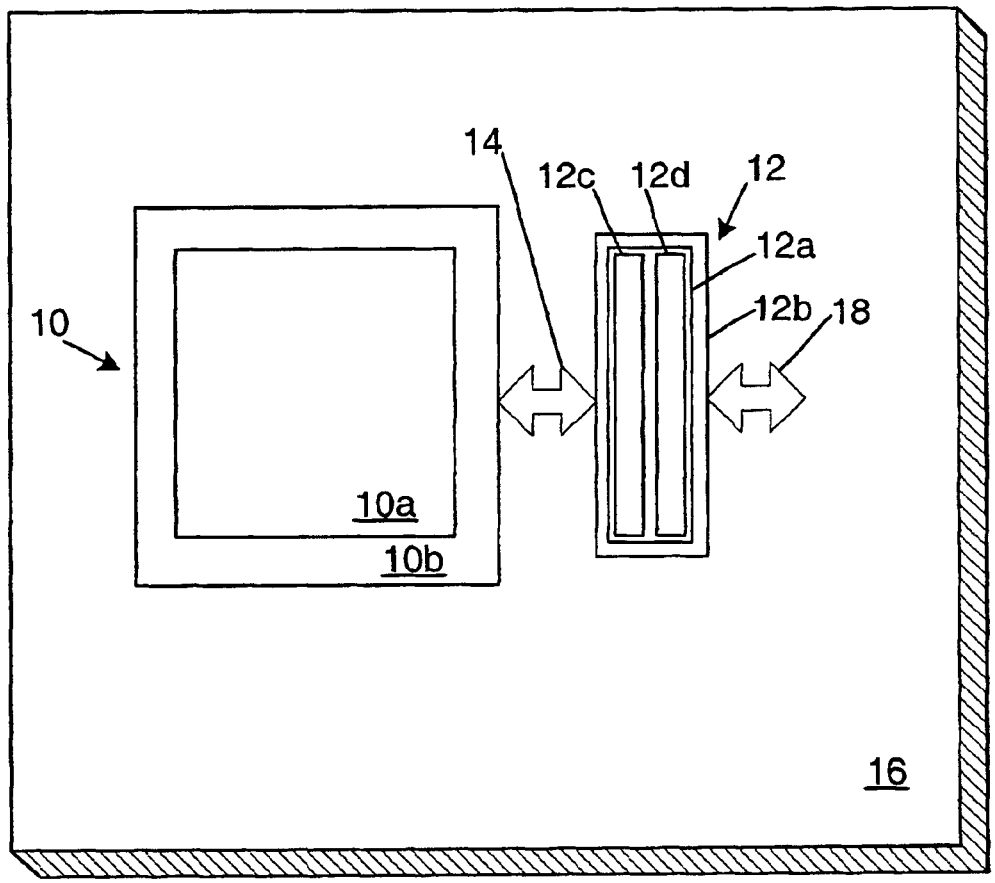
FIG. 1 depicts a schematic top view of an embodiment of a semiconductor device that includes an integrated circuit die and an HBM die having different semiconductor substrates.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

The following description generally relates to a semiconductor device that includes an integrated circuit decoupled from an HBM structure such that the integrated circuit die and the HBM die do not share the same semiconductor substrate. Turning now to the drawings, FIG. 1 illustrates a schematic top view of an embodiment of a semiconductor device. The semiconductor device may include integrated circuit die 10. Integrated circuit die 10 may include integrated circuit 10a formed on first semiconductor substrate 10b. As used herein, the term "integrated circuit" is used to refer to a primary device of an overall semiconductor device. The semiconductor device may also include HBM die 12. HBM die 12 may include HBM structure 12a formed on second semiconductor substrate 12b. The first semiconductor substrate is different than the second semiconductor substrate. For example, the first semiconductor substrate and the second semiconductor substrate may include two different monocrystalline silicon substrates.

The integrated circuit die may be coupled to the HBM die by various embodiments as described herein illustrated schematically by arrow 14. The coupling of the integrated circuit to the HBM structure may vary depending upon, for example, manufacturing and performance goals. The first and second semiconductor substrates may be coupled to package substrate 16 by various embodiments as described herein. The HBM structure may be coupled to signal traces of package substrate 16 by various embodiments as described herein as illustrated schematically by arrow 18. Arrows 14 and 18 shown in FIG. 1 are used to schematically represent the conductive paths that may be formed between the integrated circuit and the HBM structure and between the HBM structure and signal traces of the package substrate. The arrows, however, are not meant to represent actual locations, dimensions, or configurations of the conductive paths.

The integrated circuit may include logic circuitry and optionally only portions of input/output cells typically included in an integrated circuit. The integrated circuit die may also include CDM structures and other circuitry typically included in an integrated circuit. The integrated circuit may include a fixed function integrated circuit. For example, the integrated circuit may be an application specific integrated circuit (ASIC). Alternatively, the integrated circuit may be a field programmable gate array (FPGA). Furthermore, the integrated circuit may include a mixture of fixed functions and programmable functionality. In addition, the integrated circuit may include either programmable logic devices or memory devices. Furthermore, the integrated circuit may include any other integrated circuit known in the art.

In addition, the semiconductor device may include one or more integrated circuits. In this manner, the semiconductor device may be configured as a single chip module (SCM) or a multi chip module (MCM). The one or more integrated circuits may include a plurality of integrated circuits that are configured similarly (i.e., multiple ASICs or multiple FPGAs) or a plurality of integrated circuits that are configured differently (i.e., one or more ASICs and one or more FPGAs). In addition, the one or more integrated circuits may include a plurality of integrated circuits configured and/or programmed to performed similar functions or different functions.

HBM structure 12a formed on HBM die 12 may include input/output cells 12c of the integrated circuit and, in particular, at least a portion the input or output or input/output circuitry of the integrated circuit. As used herein, the term, "input/output circuitry," generally refers to a pin that may act as either an input or an output. In addition, the HBM die may include protection structures 12d coupled to the input/output cells. The protection structures may be configured to protect the input/output cells of the integrated circuit from electrostatic discharge that may be conducted through signal traces. For example, the protection structures may be configured to divert, or otherwise dissipate energy caused by a voltage spike. The voltage spike may be caused by electrostatic discharge. In this manner, the integrated circuit and the input/output cells may not be damaged by the voltage spike. The protection structures may include any protection structures known in the art.

Disposing at least a portion of the input/output cells of an integrated device and the protection structures coupled to the input/output cells in an HBM structure on a separate semiconductor substrate from the integrated circuit may allow the number of circuits of the integrated circuit die to be reduced. In this manner, lateral dimensions of the integrated circuit die may be reduced. In addition, reducing lateral dimensions of the integrated circuit die may reduce integrated circuit manufacturing costs. Alternatively, additional functionality may be placed on the integrated circuit die in the space previously occupied by the circuits moved onto the separate semiconductor substrate of the HBM die.

In addition, the integrated circuit die and the HBM die may be formed on separate substrates without affecting the level of HBM protection provided by the HBM die. In this manner, the HBM protection provided by an HBM structure formed on a separate substrate and an HBM structure formed on a common substrate may be substantially the same. Therefore, the HBM structure, the integrated circuit, and/or the overall semiconductor device may not need additional protection structures because the HBM structure has been formed on a semiconductor substrate separate from the integrated circuit.

As described above, latch-up and other problems associated with the HBM structure may be reduced, and even eliminated, by an HBM structure de-coupled from the integrated circuit. For example, carrier flow from the HBM structure into the integrated circuit may be greatly reduced because the HBM structure and the integrated circuit are formed on separate semiconductor substrates. Therefore, latch-up of the integrated circuit may be reduced due to the greatly reduced carrier flow from the HBM structure into the integrated circuit.

In addition, different manufacturing processes may be used to form the HBM structure and the integrated circuit because the HBM structure and the integrated circuit are not formed on the same semiconductor substrate. In this manner, the HBM structure may be formed using a processing technology different from that used to form the integrated circuit. For example, the integrated circuit may be formed using advanced processing technology with relatively fine line width and a relatively large number of layers of metal. In contrast, the HBM structure, due to simpler design, may be formed using more traditional technology with relatively large line width and fewer metal layers. As such, devices of the integrated circuit may have substantially different average critical dimensions than devices of the HBM structure. In addition, the HBM structure may have a different number of layers than the integrated circuit. Therefore, forming the HBM structure with more traditional technology may lower overall costs of the device.

Package substrate 16 may be a portion of a semiconductor package such as, but not limited to, a ball grid array package. The integrated circuit die and the HBM die may be coupled to the package substrate according to various embodiments described herein. Package substrate 16 may be formed of a ceramic such as aluminum oxide or a plastic material and may have conductive paths such as signal traces formed within or thereon. The signal traces may be configured to transfer input and output signals between the integrated circuit and the HBM structure and between the HBM structure and a pin of the package substrate. The conductive paths may also provide power and ground supplies through the package substrate to the protection structures of the HBM structure. The conductive paths may be formed of conductive materials such as aluminum, copper, or any other appropriate conductive material known in the art. The conductive paths may be formed through and upon various layers of the substrate and may be separated by one or more insulating layers. The insulating layers may be formed of insulating materials such as glass cloth impregnated with epoxy that is partially cured, which may be commonly referred to a "prepreg," or any other insulating material known in the art. Pins such as a ball grid array on one side of the package substrate may be coupled to an additional semiconductor substrate as described herein. In addition, the integrated circuit die and the HBM die may be coupled to the other side of the package substrate using an adhesive or using a technique such as wire bonding or surface mounting as described herein.

Figure 2:
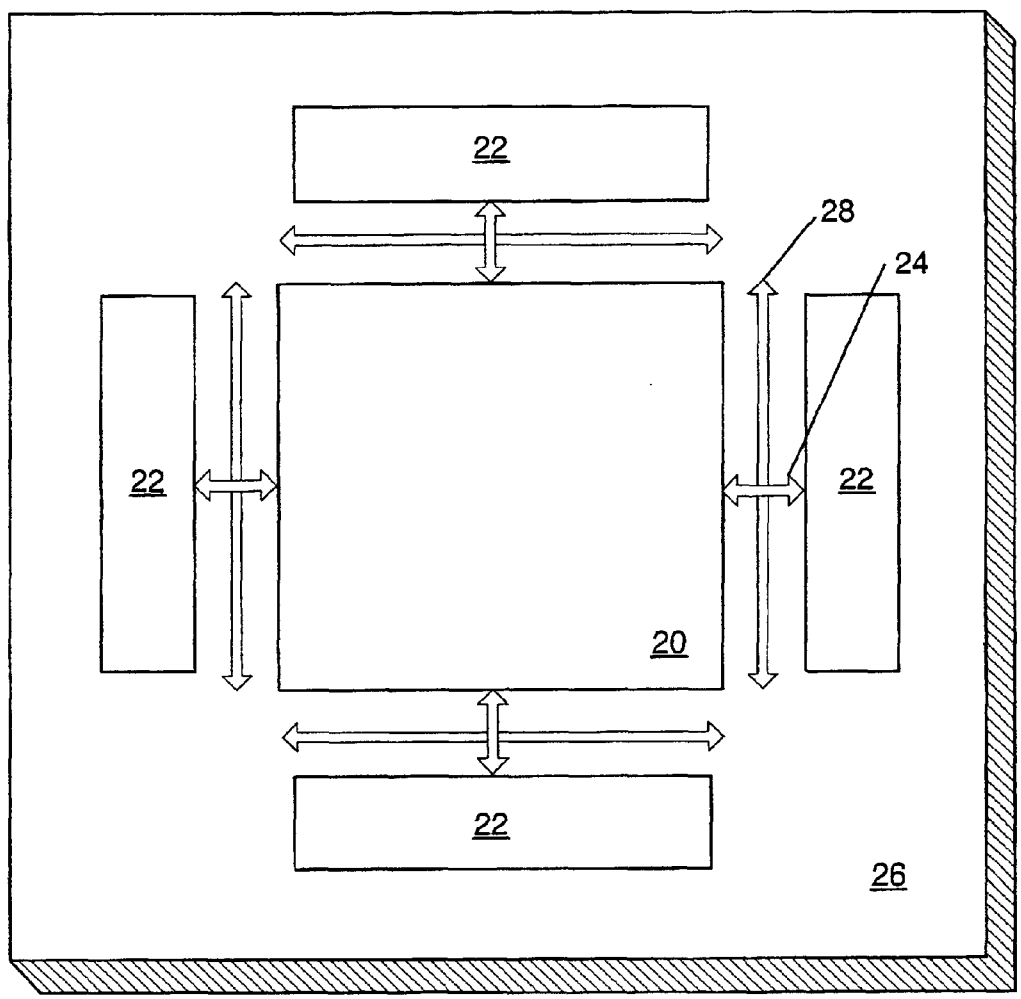
FIG. 2 depicts a schematic top view of an embodiment of a semiconductor device that includes an integrated circuit die and two or more HBM die having different semiconductor substrates.

FIG. 2 illustrates a schematic top view of an additional embodiment of a semiconductor device. The semiconductor device may include integrated circuit die 20. The integrated circuit die may include an integrated circuit (not shown) formed on a first semiconductor substrate (not shown). The integrated circuit may be further configured as described above. The integrated circuit may be coupled to package substrate 26 according to any of the embodiments described herein. The semiconductor device may also include two or more HBM die 22. For example, as shown in FIG. 2, the semiconductor device may include four HBM die 22. The number of HBM die may vary, however, depending upon, for example, a design of integrated circuit 20. In addition, a location of each of the HBM die 22 may also vary depending upon, for example, locations of the input or output or input/output structures of integrated circuit 20. As used herein, the term, "input or output or input/output structures,"

is generally defined to include any input or output or input/output structure known in the art. For example, the input or output or input/output structures may include, but are not limited to, logic structures, mixed signal structures, analog structures, and digital structures. Each of the HBM die may be coupled to package substrate 26 according to any of the embodiments described herein. The package substrate may be a portion of a ball grid array package.

Each of the HBM die may include an HBM structure (not shown) formed on separate semiconductor substrates (not shown). Each HBM die may be further configured as described herein. For example, each HBM structure may include at least a portion of the input/output cells (not shown) of the integrated circuit and one or more protection structures (not shown) coupled to the portion of the input/output cells. Thus, the input or output or input/outputs for the entire integrated circuit may be partitioned into groups on the HBM die, each of which may be served by one or more HBM structures on the die. The portion of input/output cells of each HBM structure may be coupled to the integrated circuit as illustrated schematically by arrows 24. The one or more protection structures and the input/output cells may be coupled to signal traces of package substrate 26 as illustrated schematically by arrows 28. Arrows 24 and 28 shown in FIG. 2 are used to schematically represent the conductive paths that may be formed between the integrated circuit and the HBM structure and between the HBM structure and signal traces of the package substrate. The arrows, however, are not meant to represent actual locations, dimensions, or configurations of the conductive paths.

For each of the embodiments described above, various manufacturing techniques may be used to couple the integrated circuit die, the HBM die, and signal traces. Examples of appropriate manufacturing techniques include, but are not limited to, wire bonding and solder ball bonding. It is to be understood that the various embodiments described herein are not limiting. For example, it is anticipated that the integrated circuit die, the HBM die, and the signal traces may be coupled using any manufacturing technique developed in the future. Furthermore, for simplicity, the various manufacturing techniques will be illustrated with respect to the embodiment illustrated in FIG. 1. The manufacturing techniques, however, may also be similarly applied to other embodiments such as the embodiment illustrated in FIG. 2. In addition, for simplicity, the integrated circuit, the input/output cells, the protection structures, and the first and second substrates are not shown in FIGS. 3–8. In the embodiments of FIGS. 3–8, these elements may have a configuration similar to the configuration of these elements as shown in FIG. 1.

Figure 3:
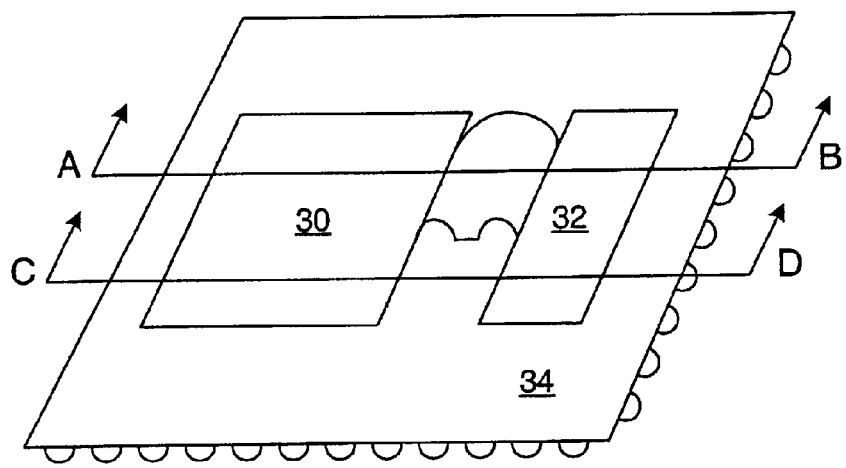
FIG. 3 depicts a schematic top view of a semiconductor device that includes an integrated circuit die and an HBM die having different semiconductor substrates according to various embodiments.
Figure 3A:
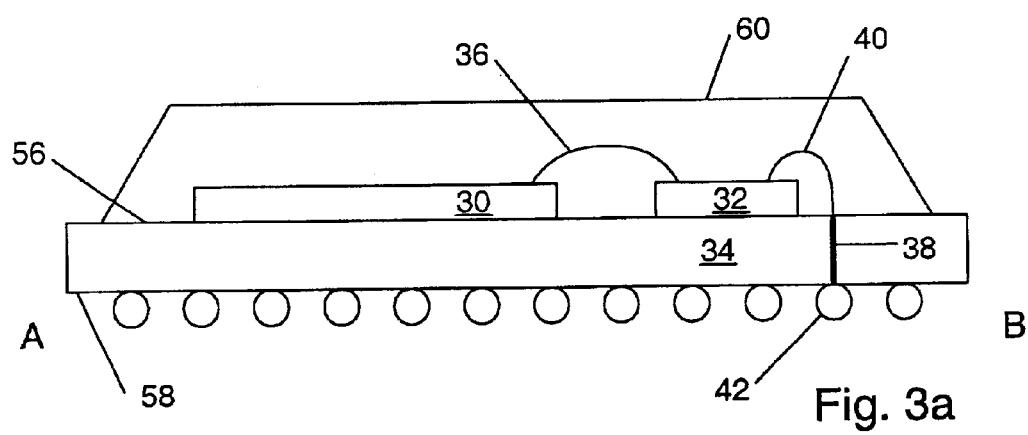
FIG. 3a depicts a cross-sectional side view of FIG. 3 along plane AB.
Figure 3B:
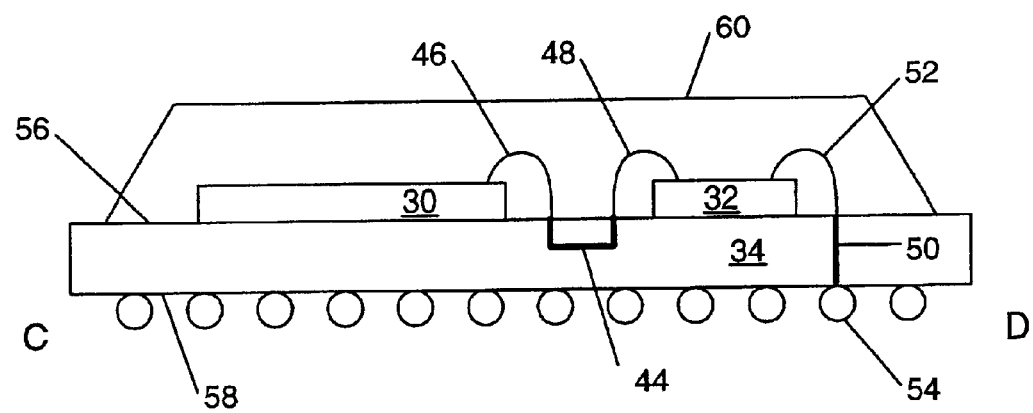
FIG. 3b depicts a cross-sectional side view of FIG. 3 along plane CD.

FIG. 3 illustrates a schematic top view of a semiconductor device that includes integrated circuit die 30 coupled to HBM die 32. The integrated circuit die may be coupled to the HBM die by wire bonding according to various embodiments described herein. Integrated circuit die may include an integrated circuit formed on a first semiconductor substrate. HBM die 32 may include an HBM structure formed on a second semiconductor substrate. The integrated circuit and the HBM structure may be configured as described herein. The first and second semiconductor substrates may be coupled to package substrate 34. FIG. 3a illustrates a cross-sectional view of the semiconductor device of FIG. 3 along plane AB in the direction of the arrows illustrated in FIG. 3. FIG. 3b illustrates a cross-sectional view of the semiconductor device of FIG. 3 along plane CD in the direction of the arrows illustrated in FIG. 3.

As shown in FIGS. 3, 3a, and 3b, the semiconductor device may include integrated circuit die 30. The integrated circuit die may be configured as described herein. The semiconductor device may also include HBM die 32, which may be configured as described herein. The integrated circuit die and the HBM die may be coupled to package substrate 34 using an adhesive to mount the integrated circuit die and the HBM die onto the package substrate. Examples of appropriate adhesives may include, but are not limited to, AuSi eutectic, AuSn eutectic, glass, silicones, polyimides, epoxies, and soft solders. The integrated circuit die and the HBM die, however, may be coupled to package substrate 34 using any method known in the art.

As shown in FIG. 3a, integrated circuit 30 may be coupled to HBM die 32 by wire bonding 36. As described above, an HBM structure may include input/output cells of the integrated circuit and, in particular, at least a portion of the input or output or input/output circuitry of the integrated circuit. In this manner, the integrated circuit may be coupled to input/output cells of the HBM structure. For example, input or output or input/output structures of the integrated circuit may be coupled to input or output or input/output circuitry of the HBM structure. In addition, protection structures or outputs of buffers of the HBM structure may be coupled to signal trace 38 of package substrate 34 by wire bonding 40. The signal trace may include a via or two or more vias coupled to one or more interconnects on various layers of the package substrate. The signal trace may couple the protection structure to a pin of the package, or ball 42 as illustrated in FIG. 3a Alternatively, the pin may include any other pin known in the art. As such, the integrated circuit and HBM die may be connected by direct die wire bonding, and the HBM die may have additional bond wires to pins of the package.

As shown in FIG. 3b, integrated circuit 30 may be coupled to signal trace 44 in package substrate 34 by wire bonding 46. Signal trace 44 may include a via or two or more vias coupled to one or more interconnects on various layers of the package substrate. In addition, HBM die 32 may be coupled to signal trace 44 by wire bonding 48. Therefore, the integrated circuit die and the HBM die may be bonded to the package substrate and connected by a signal trace within the package substrate. In this manner, the integrated circuit may be coupled to the input/output cells on the HBM structure. For example, input or output or input/output structures of the integrated circuit may be coupled to input or output or input/output circuitry of the HBM structure. In addition, the HBM structure may be coupled to signal trace 50 of package substrate 34 by wire bonding 52. As such, protection structures of the HBM structure may be coupled to the signal trace. The signal trace may be coupled as described herein. The signal trace may couple the protection structure to a pin of the package, or solder ball 54. Alternatively, the pin may include any other pin known in the art.

Surface 56 of the package substrate may include an array of pads (not shown). The array of pads may be wire bonded to bonding pads (not shown) on a surface of the integrated circuit or the HBM structure. In this manner, a signal trace of the package substrate may be coupled to the integrated circuit die and/or the HBM die. The array of pads may be formed on surface 56 of the package substrate, for example, by depositing a conductive material such as a Pb-rich alloy on the surface of the substrate. The array of pads may also be formed of a material such as gold, palladium, or any other appropriate conductive material known in the art. Bonding pads of the integrated circuit die and the HBM die may also be formed as described above.

Wire bonding may involve electrically connecting the integrated circuit die to the HBM die or the package substrate by attaching relatively small wires from a device side of the integrated circuit die to appropriate points on the HBM die or the package substrate. The HBM structure may be wire bonded to a substrate in a similar manner. Wire bonding may include either thermosonic or ultrasonic welding with a bonding method such as ball bonding and wedge bonding. Thermosonic welding is performed using downward force and horizontal oscillatory motion with an applied heat source in a bonding temperature range of about 150° C. to about 200° C. Ultrasonic welding is also performed by using downward force and horizontal oscillatory motion to form a bond but without an applied heat source. Ball bonding may include feeding a wire through a tool called a capillary and heating the wire to a liquid state such that the surface tension of the molten metal may form a spherical shape, or ball, as the wire material solidifies. The solidification of the material may be followed by thermosonic welding. Wedge bonding may include feeding a wire through a hole in the back of a bonding wedge, lowering the wedge to a pad thereby pinning the wire against the surface, and welding with either ultrasonic or thermosonic welding. Wire bonding may also include any other welding process known in the art such as thermocompression welding. Thermocompression welding may include using an applied heat source in a range of about 280° C. to about 380° C. with a relatively high downward force (compression) to form a bond.

Balls 42 and 54 may be formed upon an array of pads (not shown) formed across an area of surface 58 of the substrate. The array of pads may be formed as described herein. In this manner, an array of the balls, or a ball grid array, may be formed across surface 58. The ball grid array may be formed of a material such as, but not limited to, a Pb-rich alloy. The balls may be formed on surface 58 of substrate 34 by various processing techniques such as thin film patterning followed by evaporation of the balls through the patterned thin film and onto surface 58. As an alternative to the ball grid array, substrate 34 may include a plurality of pins (or another conductive lead structure) formed across an area of surface 58 of substrate 34 or formed proximate outer lateral edges of substrate 34.

The ball grid array may be configured to be connected to an additional semiconductor substrate (not shown). The additional semiconductor substrate may include, for example, a printed circuit board (PCB), which may also be commonly referred to as a printed wiring board (PWB), or simply a board. The board may be a daughter board or a mother board. Furthermore, the additional semiconductor substrate may also include any other semiconductor substrate known in the art such as a semiconductor substrate configured as a multichip module (MCM). The additional semiconductor substrate may be formed of a material such as ceramic or plastic and may include conductive paths formed within and/or thereon. The conductive paths may be used to connect signals traces and power and ground connections of the package substrate to one or more other systems. For example, the additional semiconductor substrate may include an array of pads configured to provide connection between a ball grid array on surface 58 of substrate 34 and the conductive paths of the additional semiconductor substrate.

To couple a ball grid array of package substrate 34 to an array of pads of an additional semiconductor substrate, package substrate 34 and an additional semiconductor substrate may be placed in close proximity to each other such that the ball grid array contacts the array of pads. The substrates may be exposed to a temperature above the melting temperature of the balls. The balls may include a lead-tin alloy (PbSn) such as a high lead solder. The composition of the solder may vary, however, depending upon a selected melting temperature for solder reflow processing. For example, the melting temperature for solder reflow processing may be selected to be lower than a temperature above which materials to which the solder will be attached may be damaged when heated. Surface tension of the molten solder during reflow may align the ball grid array to the array of pads and may create a mechanical interconnection upon solidification of the solder. In this manner, the package substrate may be coupled to an additional semiconductor substrate by the ball grid array and the array of pads.

Encapsulation 60 may be coupled to surface 56 of package substrate 34 over the integrated circuit die, the HBM die, and a portion of package substrate 34. Encapsulation 60 may be configured to hermetically or non-hermetically seal the integrated circuit die and the HBM die within the semiconductor package thereby reducing exposure of the integrated circuit die and the HBM die to the environment and/or increasing transfer of heat from the die out of the package. Alternatively, encapsulation 60 may not be coupled to surface 56 of substrate 34. Such non-encapsulated packages are known in the art and may commonly be referred to as "capless" packages.

Figure 4:
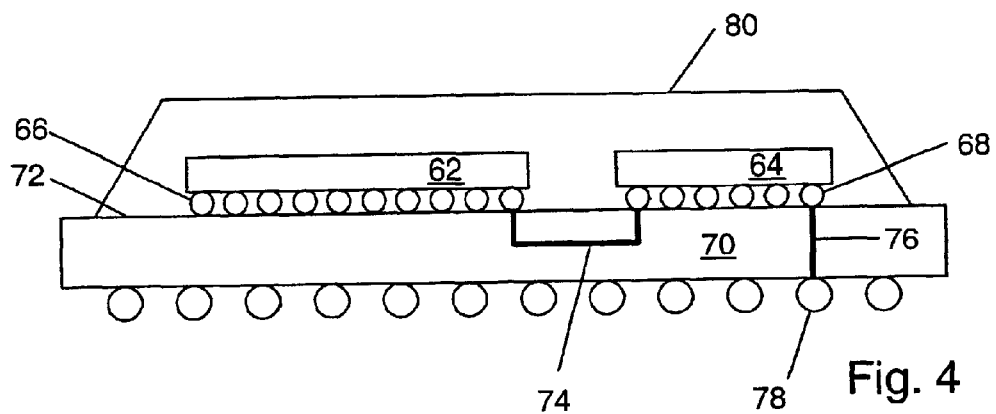
FIG. 4 depicts a cross-sectional side view of a semiconductor device that includes an integrated circuit die and an HBM die having different semiconductor substrates according to another embodiment.

FIG. 4 illustrates a cross-sectional side view of another embodiment of a semiconductor device that includes integrated circuit die 62 coupled to HBM die 64. Integrated circuit die 62 may include an integrated circuit formed on a first semiconductor substrate. HBM die 64 may include an HBM structure formed on a second semiconductor substrate. The integrated circuit die and the HBM structure may be configured as described herein. Integrated circuit die 62 may include ball grid array 66 formed on one side of the integrated circuit die. HBM die 64 may also include ball grid array 68 formed on one side of the HBM die. Ball grid arrays 66 and 68 may include materials described above and may formed by the methods described herein. Only a portion of the balls of ball grid arrays 66 and 68 are shown in FIG. 4. In addition, the number and locations of the balls in ball grid arrays 66 and 68 shown in FIG. 4 are meant to be illustrative only and do not represent an actual numbers and locations of balls in the ball grid arrays. For example, the number and locations of the balls of ball grid array 66 may vary depending upon, for example, a number and locations of input or output or input/output structures of the integrated circuit. Similarly, the number and locations of balls of ball grid array 68 may vary depending upon, for example, a number and locations of the input, output or input/output circuitry or input/output cells of the HBM structure.

Ball grid arrays 66 and 68 may be configured to couple the integrated circuit die and the HBM die, respectively, to package substrate 70. An integrated circuit coupled to a package substrate in such a manner may be commonly referred to as a flip-chip. The ball grid arrays may be coupled to an array of pads (not shown) formed on surface 72 of substrate 70 using a method as described herein. Ball grid array 66 may be configured to couple the integrated circuit to signal trace 74. Signal trace 74 may be formed within substrate 70 and may be configured as described herein. Ball grid array 68 may also be configured to couple the HBM structure to signal trace 74. In this manner, signal trace 74 may be configured to couple the integrated circuit to the HBM structure. For example, signal trace 74 may be configured to couple input or output or input/output structures of the integrated circuit to input, output or input/output circuitry or input/output cells of the HBM structure. Ball grid array 68 may be further configured to couple the HBM structure to signal trace 76. Signal trace 76 may also be coupled to ball 78. In this manner, protection structures of the HBM structure may be coupled to ball 78 of package substrate 70 by signal trace 76. Signal trace 76 and ball 78 may be further configured as described herein. Furthermore, encapsulation 80 may be coupled to package substrate 70 as described above. Alternatively, encapsulation 80 may not be coupled to the package substrate such that the substrate may be part of a "capless" package.

Figure 5:
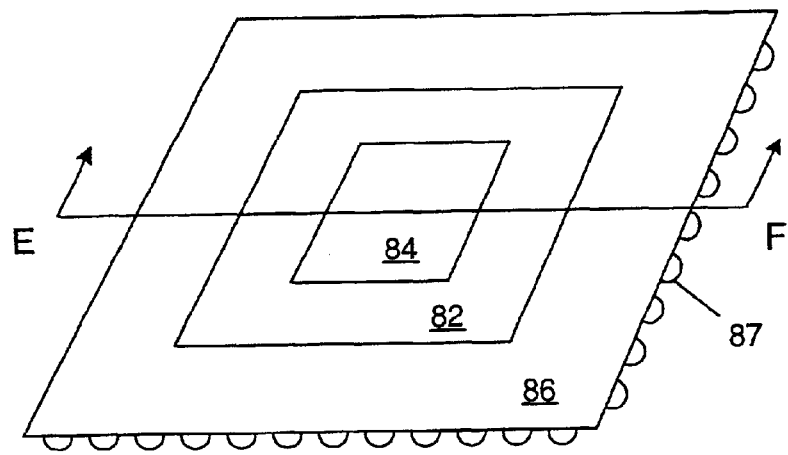
FIG. 5 depicts a schematic top view of a semiconductor device that includes an integrated circuit die and an HBM die having different semiconductor substrates according to an embodiment.

FIG. 5 illustrates a schematic top view of a semiconductor device that includes integrated circuit die 82 coupled to HBM die 84. Integrated circuit die 82 may include an integrated circuit formed on a first semiconductor substrate. HBM die 84 may include an HBM structure formed on a second semiconductor substrate. The integrated circuit die and the HBM die may be further configured as described herein. The first semiconductor substrate may be coupled to package substrate 86. The second semiconductor substrate may be coupled on top of the first semiconductor substrate. Therefore, the package substrate, the first semiconductor substrate, and the second semiconductor substrate may be coupled in a stacked configuration. Package substrate 86 may include ball grid array 87, which may include a two-dimensional array of balls formed on one side of the substrate. In this manner, package substrate 86 may be a portion of a ball grid array package. Package substrate 86, however, may include other types of pins in an array or only proximate a peripheral portion of the substrate. For example, the package substrate may have a pin grid array or a dual-in-line package configuration.

Figure 5A:
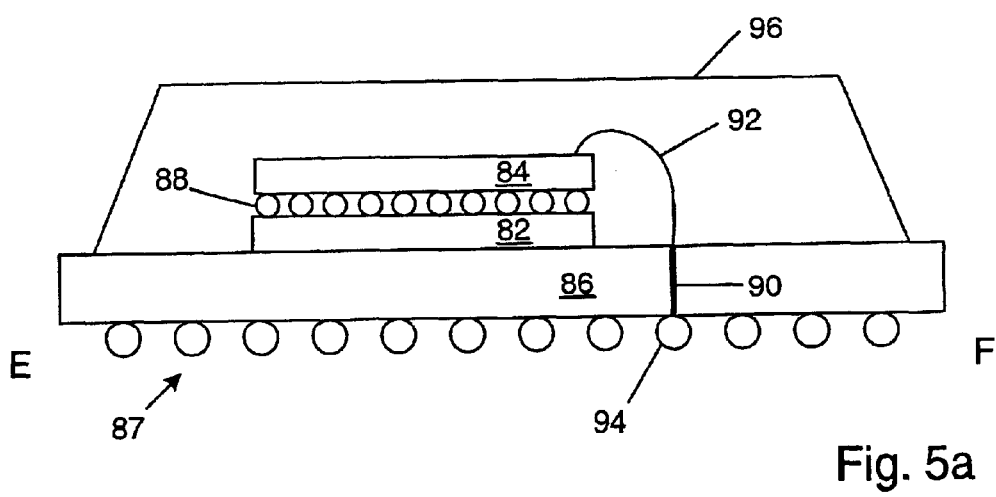
FIG. 5a depicts a cross-sectional side view of FIG. 5 along plane EF.

FIG. 5a illustrates a cross-sectional side view of the semiconductor device of FIG. 5 along plane EF in the direction of the arrows illustrated in FIG. 5. Integrated circuit die 82 may be coupled to package substrate 86 using an adhesive (not shown). The adhesive may include any of the materials as described herein. In addition, the integrated circuit die may be coupled to substrate 86 using any other method for mounting a die on a substrate known in the art. Integrated circuit die 82 may include ball grid array 88. Ball grid array 88 may be formed using processes and materials as described herein. Ball grid array 88 may be configured to couple integrated circuit die 82 to HBM die 84. For example, ball grid array 88 may be configured to couple output structures of the integrated circuit to input, output or input/output circuitry or input/output cells of the HBM structure. Such a configuration may be commonly referred to as a "flip-chip" configuration. As such, the configuration of the device illustrated in FIGS. 5 and 5a may be referred to as a flip-chip stacked ball grid array configuration.

In addition, the HBM die may be coupled to signal trace 90 of the package substrate by wire bonding 92. In this manner, protection structures of the HBM structure may be coupled to signal trace 90 of package substrate 86 by wire bonding 92. The signal traces may couple the protection structures to a pin of the package or ball 94 of ball grid array 87. The pin, however, may also include any other pin known in the art. The signal trace may be further configured as described herein. Furthermore, encapsulation 96 may be coupled to package substrate 86 as described above. Alternatively, encapsulation 96 may not be coupled to the package substrate such that the substrate may be part of a "capless" package.

Figure 5B:
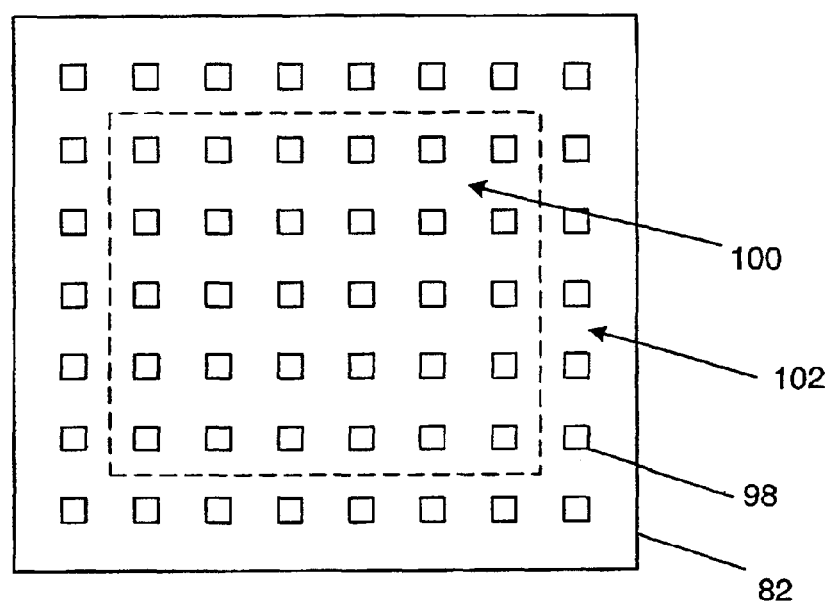
FIG. 5b depicts a schematic plan view of the integrated circuit of FIG. 5.

FIG. 5b illustrates a schematic plan view of integrated circuit die 82. Integrated circuit die 82 may include input or output or input/output structures 98 spaced across an area of the integrated circuit die. The spacing, locations, and dimensions of input or output or input/output structures 98 as shown in FIG. 5b are for illustrative purposes only and may vary depending upon, for example, the number of input or output or input/output structures required for the integrated circuit and performance characteristics of the integrated circuit. The area may include central portion 100 of the integrated circuit and peripheral portion 102 of the integrated circuit. The input or output or input/output structures may not be surrounded by guard rings. As described above, guard rings may include a continuous ring of n-diffusion in an n-well connected to $V_{DD}$ and a ring of p-diffusion in a p-well connected to $V_{SS}$ to collect minority carriers such that the carriers do not flow into a portion of the substrate occupied by the integrated circuit. Guard rings require a relatively large area of a die. Eliminating such guard rings, therefore, reduces the difficulty of silicon partitioning such that input or output or input/output structures 98 may be located within peripheral portion 102 and central portion 100 as shown in FIG. 5b. Therefore, in such an embodiment, input or output or input/output structures may be spaced across the area of the integrated circuit at convenient positions and at positions that may increase integrated circuit performance without constructing complicated tapping to isolate the HBM structure from the integrated circuit. In this manner, placing input or output or input/output structures within peripheral portion 102 and central portion 100, as opposed to only in the peripheral portion, may provide more efficient use of die space such that the performance of integrated circuits may not be limited by positioning of the input or output or input/output structures.

Balls of ball grid array 88, as shown in FIG. 5a, may be positioned proximate input or output or input/output structures 98. For example, a ball may be formed on a surface of integrated circuit die 82 above a location of an input or output or input/output structure. As described above, the HBM structure may include input or output or input/output circuitry coupled to the input or output or input/output structures of the integrated circuit. The input or output or input/output circuitry may be spaced across an area of the HBM die. The area may include a central portion of the HBM die and a peripheral portion of the HBM die. An array of pads (not shown) may be formed on one side of HBM die 84. In addition, individual pads may be positioned proximate input or output or input/output circuitry of the HBM die. For example, a pad may be formed on a surface of HBM die 84 above a location of an input/output buffer. The array of pads may be configured to be coupled with ball grid array 88 of the integrated circuit die. As described above, during reflow surface tension of the molten solder may align ball grid array 88 to the array of pads and may create a mechanical interconnection upon solidification of the solder. In this manner, the input or output or input output structures of the integrated circuit may be self-aligned to the input or output or input output circuitry of the HBM structure.

Figure 6:
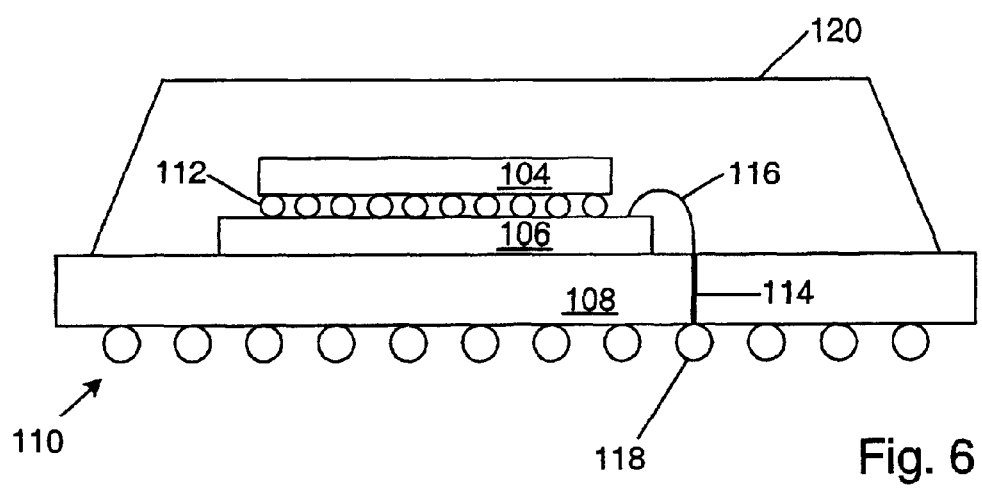
FIGS. 6–8 depicts cross-sectional side views of semiconductor devices that include an integrated circuit die and an HBM die having different semiconductor substrates according to various embodiments.

FIG. 6 illustrates a cross-sectional side view of another embodiment of a semiconductor device that includes integrated circuit die 104 coupled to HBM die 106. Integrated circuit die 104 may include an integrated circuit formed on a first semiconductor substrate. HBM die 106 may include an HBM structure formed on a second semiconductor substrate. The integrated circuit die and the HBM die may be further configured as described herein. The second semiconductor substrate may be coupled to package substrate 108. The first semiconductor substrate may be coupled on top of the second semiconductor substrate. Therefore, the package substrate, the second semiconductor substrate, and the first semiconductor substrate may be coupled in a stacked configuration. Package substrate 108 may include ball grid array 110 on one side of the substrate. In this manner, package substrate 108 may be a portion of a ball grid array package. Package substrate 108, however, may include other types of pins in an array or only proximate a peripheral portion of the substrate. For example, the package substrate may have a pin grid array or a dual-in-line package configuration. HBM die 106 may be coupled to package substrate 108 using an adhesive (not shown). The adhesive may include any of the materials as described herein. In addition, the HBM die may be coupled to substrate 108 using any other method for mounting a die on a substrate known in the art. Integrated circuit die 104 may include ball grid array 112. Ball grid array 112 may be formed using processes and materials as described herein. Ball grid array 112 may be configured to couple integrated circuit die 104 to HBM die 106. For example, ball grid array 112 may be configured to couple input or output or input/output structures of the integrated circuit to input, output or input/output circuitry or input/output cells of the HBM structure. Such a configuration may be commonly referred to as a "flip-chip" configuration. As such, the configuration of the device illustrated in FIG. 6 may be referred to as a flip-chip stacked ball grid array configuration. In addition, integrated circuit die 104 may include input or output or input/output structures spaced across an area of the integrated circuit die. The spacing and locations of the input or output or input/output structures may be configured as shown in FIG. 5b but may vary depending upon, for example, the number of input or output or input/output structures required for the integrated circuit and performance characteristics of the integrated circuit. The area may include a central portion of the integrated circuit and a peripheral portion of the integrated circuit.

In addition, the HBM die may be coupled to signal trace 114 of the package substrate by wire bonding 116. In this manner, protection structures of the HBM structure may be coupled to signal trace 114 of package substrate 108 by wire bonding 116. The signal traces may couple the protection structures to a pin of the package or ball 118. The pin, however, may also include any other pin known in the art. The signal trace may be further configured as described herein. Furthermore, encapsulation 120 may be coupled to package substrate 108 as described above. Alternatively, encapsulation 120 may not be coupled to the package substrate such that the substrate may be part of a "capless" package.

Figure 7:
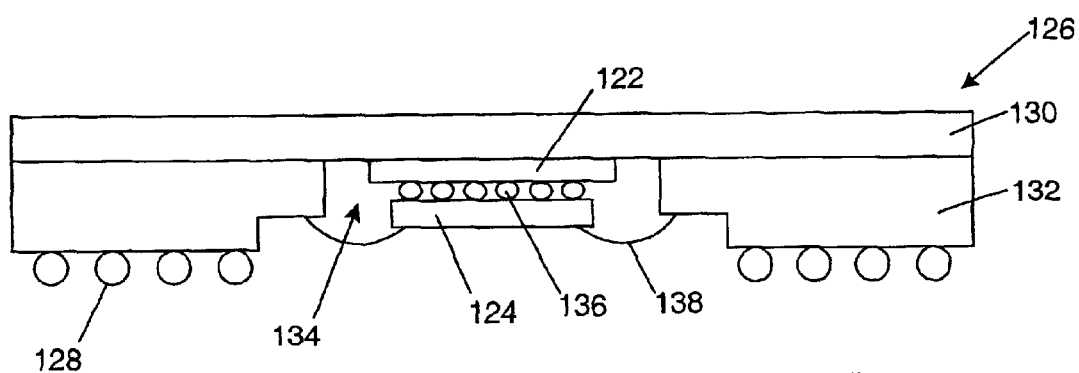

FIG. 7 illustrates a cross-sectional side view of an additional embodiment of a semiconductor device that includes integrated circuit die 122 coupled to HBM die 124. Integrated circuit die 122 may include an integrated circuit formed on a first semiconductor substrate. HBM die 124 may include an HBM structure formed on a second semiconductor substrate. The integrated circuit die and the HBM die may be further configured as described herein. The first semiconductor substrate may be coupled to package substrate 126. The second semiconductor substrate may be coupled on top of the first semiconductor substrate in a stacked configuration. Package substrate 126 may include ball grid array 128 on one side of the substrate. In this manner, package substrate 126 may be a portion of a ball grid array package. Package substrate 126, however, may include other types of pins in an array or only proximate a peripheral portion of the substrate. For example, the package substrate have a pin grid array or a dual-in-line package configuration.

Package substrate 126 may include two separate semiconductor substrates. For example, package substrate 126 may include upper substrate 130 and lower substrate 132. Upper substrate 130 and lower substrate 132 may be coupled using an adhesive (not shown) such as any of the adhesive materials described herein. Alternatively, upper substrate 130 may be coupled to lower substrate 132 by a mechanical device. The mechanical device may include any mechanical device known in the art. Lower substrate 132 may be formed having an opening proximate a central portion of the lower substrate. The opening may formed in a substrate, for example, by micromachining or by any other method known in the art. In this manner, when upper substrate 130 is coupled to lower substrate 132, the opening in lower substrate 132 will form cavity 134 in which integrated circuit die 122 and HBM die 124 may be disposed. Alternatively, package substrate 126 may include a single substrate into which a cavity may be formed using a method such as micromachining or any other method known in the art. As such, when package substrate 126 is coupled to an additional semiconductor substrate, the integrated circuit die and the HBM die may be substantially enclosed within the package substrate and the additional semiconductor substrate thereby reducing exposure of the die to the environment.

In addition, conductive paths such as signal traces and power and ground supplies may be formed in lower substrate 132 but not in upper substrate 130. In this manner, lower substrate 132 may provide signal traces and power and ground connections for integrated circuit die 122 and HBM die 124, and upper substrate 130 may provide mechanical support for the integrated circuit die and the HBM die. Alternatively, the conductive paths may be formed in both the lower substrate and the upper substrate. In addition, the lower substrate and the upper substrate may be formed of different materials or substantially similar materials. For example, if only the lower substrate includes the conductive paths as described above, the lower substrate may be formed of an insulating material separating the conductive paths. In such an example, the upper substrate may be configured to provide heat transfer from the integrated circuit die and the HBM die in addition to providing mechanical support for the integrated circuit die and the HBM die. In this manner, the upper substrate may be formed of a material that transfers more heat than the insulating material of the lower substrate.

Integrated circuit die 122 may be coupled to upper substrate 130 using an adhesive (not shown). The adhesive may include any of the materials as described herein. In addition, the integrated circuit die may be coupled to upper substrate 130 using any other method for mounting a die on a substrate known in the art. Integrated circuit die 122 may include ball grid array 136. Ball grid army 136 may be formed using processes and materials as described herein. Ball grid array 136 may be configured to couple integrated circuit die 122 to HBM die 124. For example, ball grid array 136 may be configured to couple input or output or input/output structures of the integrated circuit to input, output or input/output circuitry or input/output cells of the HBM structure. Such a configuration may be commonly referred to as a "flip-chip" configuration. As such, the configuration of the device illustrated in FIG. 7 may be referred to as a flip-chip stacked ball grid array configuration. In addition, integrated circuit die 122 may include input or output or input/output structures spaced across an area of the integrated circuit die. The spacing and locations of the input or output or input/output structures may be configured as shown in FIG. 5b but may vary depending upon, for example, the number of input or output or input/output structures required for the integrated circuit and performance characteristics of the integrated circuit. The area may include a central portion of the integrated circuit and a peripheral portion of the integrated circuit.

In addition, the HBM die may be coupled to signal traces (not shown) of the package substrate by wire bonding 138. In this manner, protection structures of the HBM structure may be coupled to the signal traces of lower substrate 132 by wire bonding 138. The signal traces may couple the protection structures to pins of the package such as ball s grid array 128. The pins, however, may also include any other pins known in the art The signal traces may be further configured as described herein.

Figure 8:
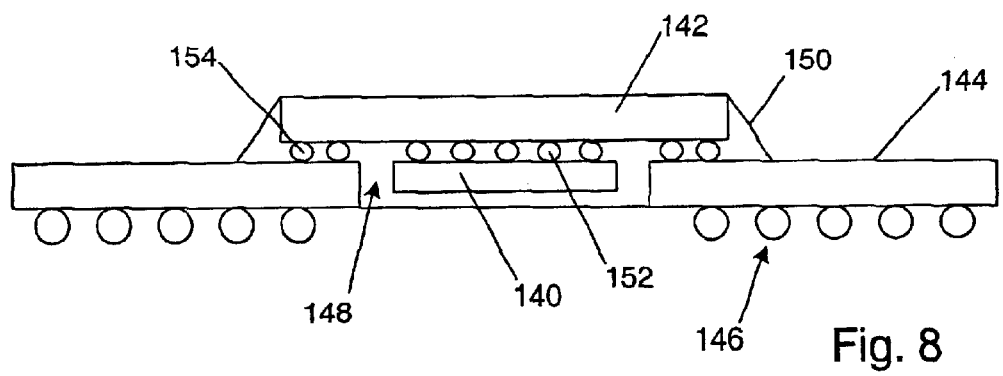

FIG. 8 illustrates a cross-sectional side view of a yet another embodiment of a semiconductor device that includes integrated circuit die 140 coupled to HBM die 142. Integrated circuit die 140 may include an integrated circuit formed on a first semiconductor substrate. HBM die 142 may include an HBM structure formed on a second semiconductor substrate. The integrated circuit die and the HBM die may be further configured as described herein. The first semiconductor substrate may be coupled to the second semiconductor substrate, and the second semiconductor substrate may be coupled to package substrate 144 in a stacked configuration. Package substrate 144 may include ball grid array 146 on one side of the substrate. In this manner, package substrate 144 may be a portion of a ball grid array package. Package substrate 144, however, may include other types of pins in an array or only proximate a peripheral portion of the substrate. For example, the package substrate have a pin grid array or a dual-in-line package configuration.

Package substrate 144 may include an opening formed in the substrate, for example, by micromachining or any other method known in the art. In this manner, when HBM die 142 is coupled to package substrate 144, the opening in package substrate 144 will form cavity 148 into which integrated circuit die 140 may be disposed. Alternatively, package substrate 144 may include an upper substrate and a lower substrate configured as described above. Furthermore, encapsulation 150 may be coupled to package substrate 144 and HBM die 142. Encapsulation 150 may be fighter configured as described above. Alternatively, encapsulation 150 may not be coupled to the package substrate and the HBM die such that the substrate may be part of a "capless" package. As such, the integrated circuit die may be substantially enclosed within the HBM die and the package substrate, or the HBM die, the encapsulation, and the package substrate thereby reducing exposure of the die to the environment.

Integrated circuit die 140 may include ball grid array 152. Ball grid array 152 may be formed using processes and materials as described herein. Ball grid array 152 may be configured to couple integrated circuit die 140 to HBM die 142. For example, ball grid array 152 may be configured to couple input or output or input/output structures of the integrated circuit to input, output or input/output circuitry or input/output cells of the HBM structure. Such a configuration may be commonly referred to as a "flip-chip" configuration. As such, the configuration of the device illustrated in FIG. 8 may be referred to as a flip-chip stacked ball grid array configuration. In addition, integrated circuit die 140 may include input or output or input/output structures spaced across an area of the integrated circuit die. The spacing and locations of the input or output or input/output structures may be configured as shown in FIG. 5*b* but may vary depending upon, for example, the number of input or output or input/output structures required for the integrated circuit and performance characteristics of the integrated circuit. The area may include a central portion of the integrated circuit and a peripheral portion of the integrated circuit.

In addition, the HBM die may be coupled to signal traces (not shown) of the package substrate by ball grid array 154. Ball grid array 154 may be formed using processes and materials as described herein. In this manner, protection structures of the HBM structure may be coupled to the signal traces of package substrate 144 by ball grid array 154. The signal traces may couple the protection structures to pins of the package such as ball grid array 146. The pins, however, may also include any other pins known in the art. Therefore, the HBM die may be coupled to the integrated circuit die and to the package substrate by ball grid arrays. Such a coupling method may sometimes be referred to as silicon-on-silicon (Si—on—Si).

Figure 9:
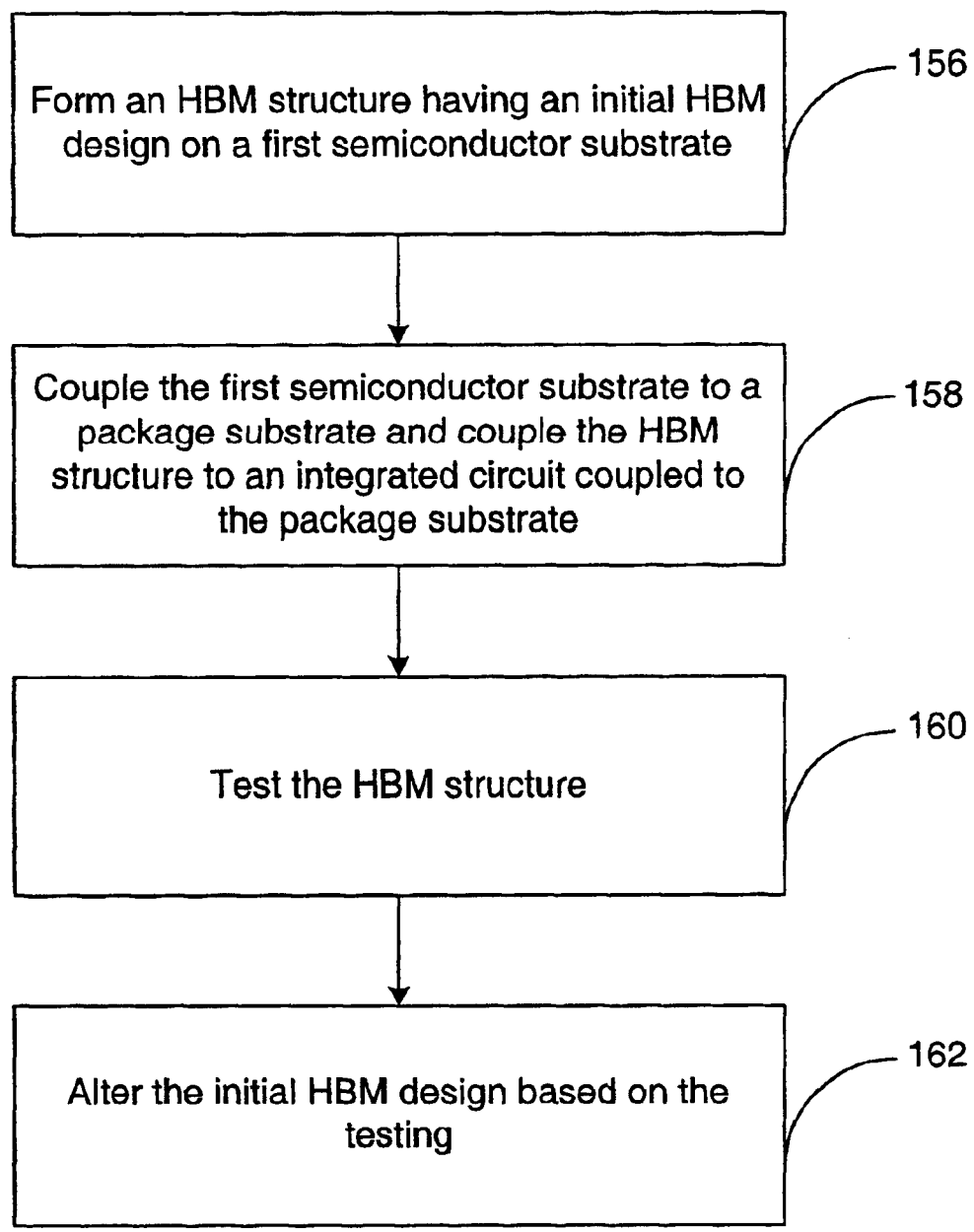
FIG. 9 depicts a flow chart illustrating an embodiment of a method for developing a design for an HBM structure.

FIG. 9 is a flow chart illustrating an embodiment of a method for developing a design for an HBM structure. The method may include forming an HBM structure having an initial HBM design on a first semiconductor substrate, as shown in step 156. The initial HBM design may be determined without experimentation. For example, the HBM model and characteristics of the integrated circuit may be used to theoretically determine an initial HBM design. Alternatively, the initial HBM design may be a design of an HBM structure used to protect another integrated circuit. The other integrated circuit may have characteristics similar to the characteristics of the integrated circuit for which the HBM structure is being developed. For example, the other integrated circuits may be designed and formed using technology that is a generation earlier than the technology used to design and form the integrated circuit for which the HBM structure is being developed.

The method may also include coupling the first semiconductor substrate to a package substrate and coupling the HBM structure to an integrated circuit coupled to the package substrate, as shown in step 158. The integrated circuit may be formed on a second semiconductor substrate. Coupling the first semiconductor substrate to the package substrate may be performed using any of the methods as described herein. For example, the HBM structure may be coupled to the package substrate using an adhesive, wire bonding, and/or a ball grid array. In addition, coupling the HBM structure to the integrated circuit may be performed using any of the methods as described herein. For example, the HBM structure may be coupled to the integrated circuit using wire bonding or a bald grid array. Coupling the first semiconductor substrate to the package substrate and coupling the HBM structure to the integrated circuit may also include any other method known in the art.

In addition, the method may include testing the HBM structure, as shown in step 160. For example, testing the HBM structure may include applying a voltage spike to the HBM structure. The voltage applied to the HBM structure may be determined by protection requirements for the integrated circuit. For example, the applied voltage may be greater than approximately a maximum voltage that may be applied to the integrated circuit without damaging the integrated circuit. The voltage applied to the HBM structure may also be determined theoretically from a model such as the HBM model. The testing may also include measuring a reaction and/or a reaction time of the HBM structure to the voltage spike. The testing may further include measuring an amount of energy dissipated by the HBM structure in response to the voltage spike. Furthermore, the testing may include measuring the current consumption and capacitance of the HBM structure. In addition, the testing may also include any other electrostatic discharge testing known in the art.

The method may further include altering the initial HBM design based on the testing, as shown in step 162. For example, the electrical characteristics of the protection structures of the initial HBM design may be altered based on the measured reaction and/or reaction time of the HBM structure to the voltage spike, the measured amount of energy dissipated by the HBM structure, and/or the measured current consumption and capacitance of the HBM structure. In addition, the physical, or material, characteristics of the protection structures of the initial HBM design may be altered based on any of the properties of the HBM structure measured during the testing.

Altering the design of the HBM structure does not require altering the design of the integrated circuit and vice versa because the HBM structure and the integrated circuit are formed on separate semiconductor substrates. Therefore, the method may include forming an additional HBM structure having the altered initial design without altering a design of the integrated circuit. In an embodiment, the method may include altering a design of the integrated circuit without further altering the initial design of the HBM structure. Altering one of the die, instead of both die, will reduce re-layout time and costs associated with re-layout of both die. In addition, developing an HBM structure separately from an integrated circuit may reduce the development time for the HBM structure thereby speeding product launch.

Different manufacturing processes may be used to form the HBM structure and the integrated circuit because the HBM structure and the integrated circuit are not formed on the same semiconductor substrate. As such, the method may also include forming an additional HBM structure having the altered initial design without altering manufacturing of the integrated circuit. In addition, the method may include forming an additional HBM structure having the altered initial design without manufacturing an additional integrated circuit. Therefore, such embodiments may reduce the costs of manufacturing another integrated circuit on the same die as the additional HBM structure. Additional HBM structures having altered initial designs may be experimentally tested, and further altered if necessary, as described herein.

Furthermore, because the HBM structure may be manufactured separately from the integrated circuit, the HBM structure may be used to protect other integrated circuits, and perhaps, at a reduced cost because the structure does not have to be integrated into the integrated circuit die. In another embodiment, the method may further include using the HBM structure until an additional HBM structure having the altered initial design can be formed and coupled to the integrated circuit. In this manner, if the HBM structure will sufficiently protect a new integrated circuit product, the HBM structure may be used as an interim solution for the new integrated circuit product while an optimal HBM structure is being developed for the new product thereby reducing product delay. As such, the new product may be shipped as an HBM protected device while the development for an optimal HBM structure continues. Such a method may also be used for integrated circuits having an integrated HBM structure.

It will be appreciated to those skilled in the art having the benefit of this disclosure that this invention is believed to provide a method of providing HBM protection with an HBM structure de-coupled from the integrated circuit. Further modifications and alternative embodiments of various aspects of the invention will be apparent to those skilled in the art in view of this description. For example, the HBM structures described herein may include any electrostatic discharge protection structures known in the art. In addition, the HBM structures may be designed using any electrostatic discharge model known in the art such as the charged device model (CDM) and the machine model (MM). It is intended that the following claims be interpreted to embrace all such modifications and changes and, accordingly, the drawings and the specification are to be regarded in an illustrative rather than a restrictive sense.

What is claimed is:

1. A semiconductor device, comprising:
   an integrated circuit formed on a first semiconductor substrate;
   an HBM structure formed on a second semiconductor substrate, wherein the HBM structure comprises:
   input/output cells of the integrated circuit having input or output or input/output circuitry coupled to the integrated circuit; and
   protection structures coupled to the input or output or input/output circuitry; and
   a package substrate to which the first and second semiconductor substrates are connected.

2. The semiconductor device of claim 1, wherein the protection structures are further coupled to signal traces of the package substrate.

3. The semiconductor device of claim 1, wherein the HBM structure further comprises input/output cells of the integrated circuit, and wherein the input/output cells comprise the input or output or input/output circuitry.

4. The semiconductor device of claim 1, further comprising two or more HBM structures, wherein each of the two or more HBM structures comprises a portion of the input/output cells of the integrated circuit, comprising the input or output or input/output circuitry, and a portion of the protection structures coupled to the input or output or input/output circuitry.

5. The semiconductor device of claim 1, wherein latch-up of the integrated circuit is reduced due to limited carrier flow from the HBM structure into the integrated circuit.

6. The semiconductor device of claim 1, wherein devices of the HBM structure have substantially different average critical dimensions than devices of the integrated circuit.

7. The semiconductor device of claim 1, wherein the HBM structure has a different number of layers than the integrated circuit.

8. The semiconductor device of claim 1, wherein the input or output or input output circuitry is further coupled to the integrated circuit by wire bonding.

9. The semiconductor device of claim 1, wherein the input or output or input output circuitry and the integrated circuit are connected to a common signal trace within the package substrate by wire bonding.

10. The semiconductor device of claim 1, wherein the input or output or input/output circuitry and the integrated circuit are connected to a common signal trace within the package substrate by solder bumps.

11. A semiconductor device, comprising:
    an integrated circuit formed on a first semiconductor substrate comprising input or output or input/output structures spaced across an area of the integrated circuit;
    an HBM structure formed on a second semiconductor substrate comprising input or output or input/output circuitry coupled to the input or output or input/output structures and protection structures coupled to the input or output or input/output circuitry; and a package substrate to which the first and second semiconductor substrates are connected in a stacked configuration.

12. The semiconductor device of claim 11, wherein the area comprises a central portion of the integrated circuit and a peripheral portion of the integrated circuit.

13. The semiconductor device of claim 11, wherein the input or output or input/output structures are not surrounded by guard rings.

14. The semiconductor device of claim 11, wherein the input or output or input/output structures are self-aligned to the input or output or input/output circuitry.

15. The semiconductor device of claim 11, wherein the first semiconductor substrate is interposed between the second semiconductor substrate and the package substrate.

16. The semiconductor device of claim 11, wherein the second semiconductor substrate is interposed between the first semiconductor substrate and the package substrate.

17. A semiconductor device, comprising:

an integrated circuit formed on a first semiconductor substrate;

an HBM structure formed on a second semiconductor substrate, wherein the HBM structure comprises input or output or input/output circuitry which is coupled to the integrated circuit and protection structures coupled to the input or output or input/output circuitry; and a package substrate comprising a cavity in which the integrated circuit is disposed.

18. The semiconductor device of claim 17, wherein the HBM structure is disposed within the cavity.

19. The semiconductor device of claim 17, wherein the HBM structure is arranged above the package substrate.

20. The semiconductor device of claim 17, wherein the package substrate comprises:

a first portion having separated segment between which the cavity is arranged; and a second portion strapping the separated segments.

* * * * *

UNITED STATES PATENT AND TRADEMARK OFFICE
CERTIFICATE OF CORRECTION

PATENT NO. : 6,734,504 B1  
DATED : May 11, 2004  
INVENTOR(S) : Lie et al.

Page 1 of 1

It is certified that error appears in the above-identified patent and that said Letters Patent is hereby corrected as shown below:

Column 20,
Lines 49 and 52, please delete "input output" and substitute therefor -- input/output --.

Signed and Sealed this

Thirteenth Day of September, 2005

JON W. DUDAS
*Director of the United States Patent and Trademark Office*